(12) United States Patent
Baik et al.

(10) Patent No.: US 7,981,750 B2
(45) Date of Patent: Jul. 19, 2011

(54) METHODS OF FABRICATION OF CHANNEL-STRESSED SEMICONDUCTOR DEVICES

(75) Inventors: Hion-suck Baik, Cheonan-si (KR); Jong-bong Park, Suwon-si (KR); Jung-yun Won, Hwaseong-si (KR); Hwa-sung Rhee, Seongnam-si (KR); Byung-seo Kim, Suwon-si (KR); Ho Lee, Cheonan-si (KR); Myung-sun Kim, Hwseong-si (KR); Ji-hye Yi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 428 days.

(21) Appl. No.: 12/138,502

(22) Filed: Jun. 13, 2008

(65) Prior Publication Data

US 2009/0020820 A1    Jan. 22, 2009

(30) Foreign Application Priority Data

Jul. 16, 2007  (KR) .................. 10-2007-0071276

(51) Int. Cl.
*H01L 21/336* (2006.01)
(52) U.S. Cl. .................. 438/300; 438/938; 257/E21.09; 257/E21.634

(58) Field of Classification Search .............. 438/300, 438/938, 939
See application file for complete search history.

(56) References Cited

U.S. PATENT DOCUMENTS

| 6,870,179 | B2 | 3/2005 | Shaheed et al. | |
| 6,906,393 | B2 | 6/2005 | Sayama et al. | |
| 7,608,499 | B2* | 10/2009 | Romero et al. | 438/199 |
| 7,820,500 | B2* | 10/2010 | Ning | 438/199 |
| 2004/0262683 | A1 | 12/2004 | Bohr et al. | |
| 2005/0136583 | A1 | 6/2005 | Chen et al. | |
| 2005/0164431 | A1 | 7/2005 | Bu et al. | |
| 2005/0218455 | A1* | 10/2005 | Maeda et al. | 257/368 |
| 2006/0024898 | A1* | 2/2006 | Chidambaram et al. | 438/303 |
| 2006/0138398 | A1 | 6/2006 | Shimamune et al. | |
| 2007/0200179 | A1* | 8/2007 | Chen | 257/369 |
| 2008/0242020 | A1* | 10/2008 | Chen et al. | 438/233 |

* cited by examiner

*Primary Examiner* — Jerome Jackson, Jr.
*Assistant Examiner* — Paul A Budd
(74) *Attorney, Agent, or Firm* — Volentine & Whitt, PLLC (57) ABSTRACT

In one aspect, a method of fabricating a semiconductor device is provided. The method includes forming at least one capping layer over epitaxial source/drain regions of a PMOS device, forming a stress memorization (SM) layer over the PMOS device including the at least one capping layer and over an adjacent NMOS device, and treating the SM layer formed over the NMOS and PMOS devices to induce tensile stress in a channel region of the NMOS device.

23 Claims, 10 Drawing Sheets

METHODS OF FABRICATION OF CHANNEL-STRESSED SEMICONDUCTOR DEVICES

BACKGROUND OF THE INVENTION

1. Field of the Invention

The present invention generally relates to semiconductor devices and to the fabrication thereof, and more particularly, the present invention relates to semiconductor devices utilizing stress memorization, and to methods of fabricating the same.

2. Description of the Related Art

Transistor devices have been reduced in size to the extent where scaling limitations (e.g., gate oxide leakage and short channel effects) are becoming a significant roadblock to further device integration. The consensus in the art is that improvements in "channel mobility" can largely overcome or reduce the adverse effects these scaling limitations. Channel mobility generally refers to the ease with which electrons (for NMOS devices) and holes (for PMOS devices) are capable of being transferred within the channel region of the transistor device.

One technique being explored to enhance channel mobility is to induce strain within the channel region to thereby physically elongate or compress atomic bonds. In particular, tensile stress within the channel region of an NMOS device has been found to improve electron mobility in the channel, while compressive stress within the channel region of a PMOS device can improve hole mobility within the channel.

"Stress memorization" (SM) is one technique that may be utilized to induce tensile stress within the channel region of an NMOS device. Here, an SM layer is deposited over the gate structure of the NMOS device. The SM layer is generally formed of an insulating material, such as SiN. During a subsequent anneal, tensile stresses induced in the SM layer cause compressive stresses in the gate electrode and in the adjacent source and drain regions. These compressive stresses cause tensile stress to be induced in the channel region of the NMOS device. These stresses are "memorized" during the anneal process, and the SM layer is then removed.

However, the channel region tensile stress induced by the SM layer can adversely impact the operating performance of an adjacent PMOS device. Accordingly, the SM layer must be patterned to remove the portion thereof overlying the PMOS device prior to the anneal process. This requires execution of additional masking and etching processes, thus increasing costs and fabrication times.

In the meantime, one technique utilized to induce compressive stress within a PMOS device is to epitaxially grow SiGe source/drain regions on opposite sides of the channel region. The SiGe epitaxial regions have a larger lattice constant than that of the intervening channel region. The resultant tensile stress in the epitaxial regions induces a compressive stress in the channel region of the PMOS region. Hole mobility in the channel therefore increases, which in turn enhances the operating speed of the PMOS transistor.

Again, however, in order to avoid degradation in the performance of the PMOS transistor, it is necessary to perform the costly and time consuming steps associated with patterning the SM layer to remove the same from over the PMOS device prior to annealing the SM layer to induce tensile stress the NMOS channel.

SUMMARY OF THE INVENTION

According to an aspect of the present invention, a method of fabricating a semiconductor device is provided. The method includes forming at least one capping layer over epitaxial source/drain regions of a PMOS device, forming a stress memorization (SM) layer over the PMOS device including the at least one capping layer and over an adjacent NMOS device, and treating the SM layer formed over the NMOS and PMOS devices to induce tensile stress in a channel region of the NMOS device.

According to another aspect of the present invention, a method of manufacturing a semiconductor device is provided. The method includes providing a substrate including an NMOS region and a PMOS region, and gate structures respectively located over the NMOS region and PMOS region, forming first and second trenches in the substrate adjacent the gate structure of the PMOS region, forming epitaxial source and drain regions within the first and second trenches, respectively, forming at least one capping layer over the epitaxial source and drain regions, forming a stress memorization (SM) layer over the NMOS and PMOS regions, including the at least one capping layer, and annealing the SM layer formed over the NMOS and PMOS regions.

According to still another aspect of the present invention, a method of manufacturing a semiconductor device is provided. The method includes interposing at least one capping layer between a PMOS device and a stress memorization (SM) layer, and treating the SM layer to induce tensile stress in an NMOS device located adjacent the PMOS device.

According to yet another aspect of the present invention, a semiconductor device, is provided. The semiconductor device includes a PMOS device and an NMOS device. The PMOS device includes a gate structure located over a substrate, epitaxial source and drain regions located in the substrate adjacent the gate structure, and a channel region located between the epitaxial source and drain regions. The NMOS device includes a gate structure located over the substrate, first and second recesses located in a surface of the substrate adjacent the gate structure, source and drain regions formed in the substrate and below the first and second recesses of the substrate, and a channel region located between the source and drain regions.

BRIEF DESCRIPTION OF THE DRAWINGS

Aspects and features of embodiments of the present invention will become readily apparent from the detailed description that follows, with reference to the accompanying drawings, in which.

DETAILED DESCRIPTION OF EMBODIMENTS

The present invention will now be described by way of preferred, but non-limiting, embodiments of the invention.

For ease of understanding and to avoid redundancy, like reference numbers refer to the same or similar elements throughout the drawings. Also, while the drawings contain a number of cross-sectional views, it will be understood that the views are not necessarily drawn to scale, and that the relative thicknesses of the illustrated layers may be exaggerated for clarity. Further, when a layer is referred to as being formed "on" another layer, it can be directly on the other layer or one or more intervening layers may be present. In contrast, if a layer is referred to as being "directly on" another layer, then no intervening layers or elements are present. Other words used to describe the relationship between elements should be interpreted in a like fashion (e.g., "between" versus "directly between," "adjacent" versus "directly adjacent," "connected" versus "directly connected," etc.).

A method of fabricating a semiconductor device according to a non-limiting embodiment of the present invention will now be described with reference to FIGS. 1A through 1I of the drawings.

Figure 1A:
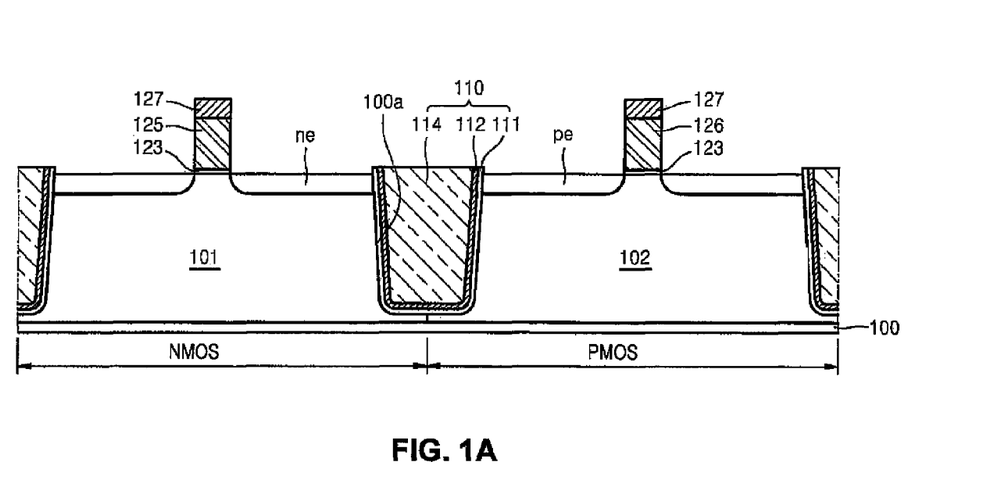
FIGS. 1A through 1I are cross-sectional views for use in explaining a method of manufacturing a semiconductor device according to an embodiment of the present invention.

Initially, referring to FIG. 1A, device isolation regions 110 are formed to define an NMOS region and a PMOS region of a substrate 100. Various types of isolation regions and fabrication techniques thereof are well-known in the art. In the illustrated example, each device isolation region 110 is formed in a trench 100a, and includes an oxide liner 111, a nitride liner 112, and an isolation layer 114. Also, as shown in FIG. 1A, a p-well 101 is formed in the NMOS region of the substrate 100, and an n-well 102 is formed in the PMOS region of the substrate 100.

Next, gate structures are formed over the p-well 101 and n-well 102. A variety of gate structures and fabrication techniques thereof are well-known in the art. In the illustrated example of FIG. 1A, each gate structure includes a stacked structure of a gate insulating layer 123, a gate electrode 125, and a gate capping layer 127. The gate insulating layer 123 may, for example, be formed of $SiO_2$, $HfO_2$ or $Ta_2O_5$. The gate electrode 125 may, for example, be formed of polysilicon. The gate capping layer 127 may, for example, be formed of SiN, and may, for example, have a thickness of 300 to 500 Å.

Still referring to FIG. 1A, by utilizing the gate structures as a mask, n-type source/drain extensions ne are formed in the p-well 101, and p-type source/drain extensions pe are formed in the n-well 102. The extensions ne and pe may be formed using conventional masking and implantation processes.

Figure 1B:
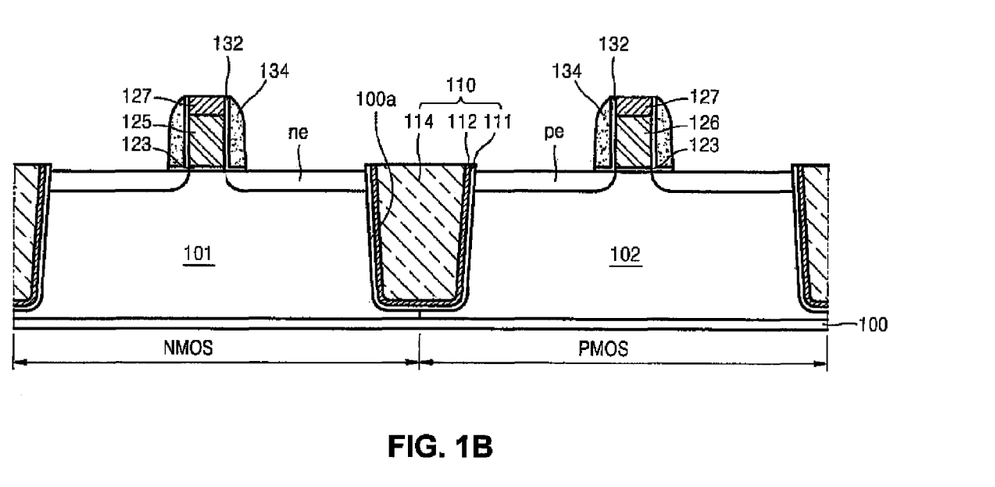

Referring now to FIG. 1B, sidewall spacers are formed on the gate structures of FIG. 1A. A variety of sidewall spacers and fabrication techniques thereof are well-known in the art. In the example of FIG. 1B, each sidewall spacer includes a first L-shaped spacer 132, and a second spacer 134, which together cover a portion of the surface of the substrate 100 adjacent the gate structures. The first L-shaped spacer 132 may, for example, be formed of SiON, and the second spacer 134 may, for example, be formed of SiN or SiON.

Figure 1C:
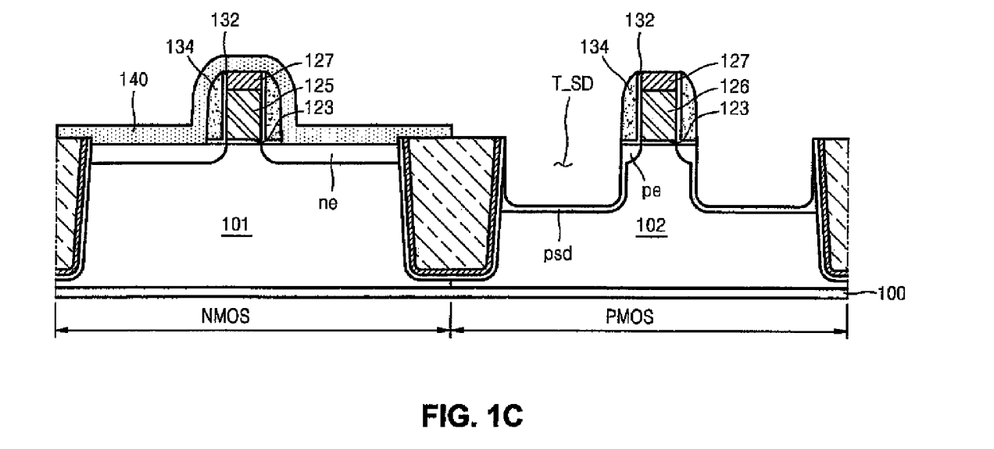

Turning to FIG. 1C, a resist mask 140 is formed (e.g., by photolithography) to cover the NMOS region and expose the PMOS region of the substrate 100. The resist mask 140 may, for example, be formed of a layer of SiN or SiON, and may, for example, have a thickness of 100 to 150 Å.

Next, still referring to FIG. 1C, trenches T_SD are formed in the substrate 100 on opposite sides of the gate structure of PMOS region. In the example of this embodiment, the trenches T_SD are formed by anisotropic etching, using the gate and sidewall structure as a mask. The trenches T_SD may, for example, be formed to a depth of 300 to 1200 Å. P-type impurities are then implanted to form p-type source/drain regions psd at bottom and sidewalls of the trenches T_SD.

Figure 1D:
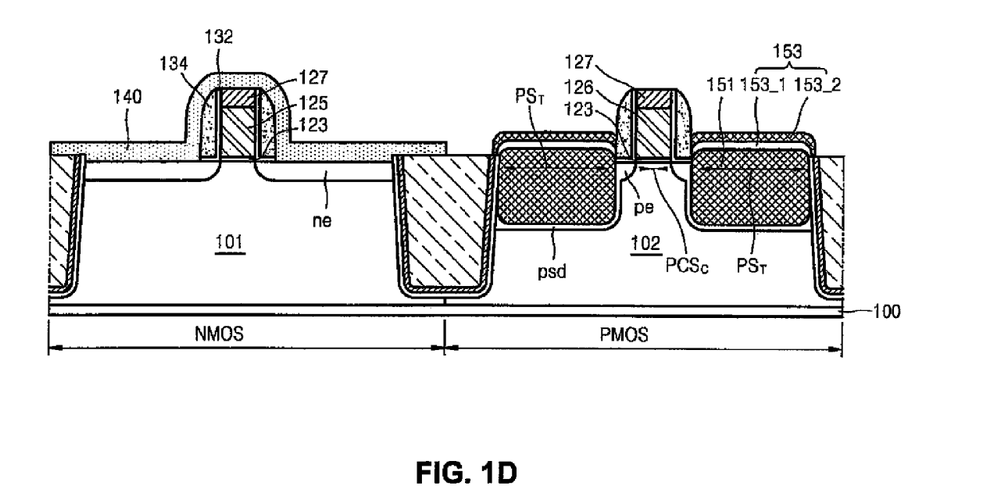

Referring now to FIG. 1D, epitaxial layers 151 are grown in the trenches T_SD of the PMOS region. In the example of this embodiment, the epitaxial layers 151 are formed by epitaxial growth of SiGe. Also in the example of this embodiment, the epitaxial layers completely fill the trenches T_SD of the PMOS region, and protrude above a surface of the substrate 100. P-type impurity doping of the epitaxial layers 151 may, for example, be performed in situ during the epitaxial growth process.

The epitaxial layers 151 have a larger lattice constant larger than that of the silicon substrate, and as shown in FIG. 1D, the epitaxial layers 151 are under tensile stress $PS_T$. The resultant deformation in the epitaxial layers 151 induces a compressive stress $PCS_C$ in the channel of the PMOS region. Hole mobility in the channel therefore increases, which in turn enhances the operating speed of the PMOS transistor.

Then, as shown in FIG. 1D, one or more capping layers 153 are formed over the epitaxial layers 151. In particular, in the example of this embodiment, a first capping layer 153_1 and a second capping layer 153_2 are successively formed over the epitaxial layers 151. For example, the first epitaxial layer 153_1 may be formed by epitaxial growth of Si to form a silicon epitaxial capping layer. The second epitaxial layer 153_2 may be formed by epitaxial growth of SiGe to form a SiGe epitaxial capping layer. As examples, the first capping layer 153_1 may be formed to a thickness of 30 to 300 Å, while the second capping layer 153_2 may be formed to a thickness of 100 to 500 Å.

Figure 2:
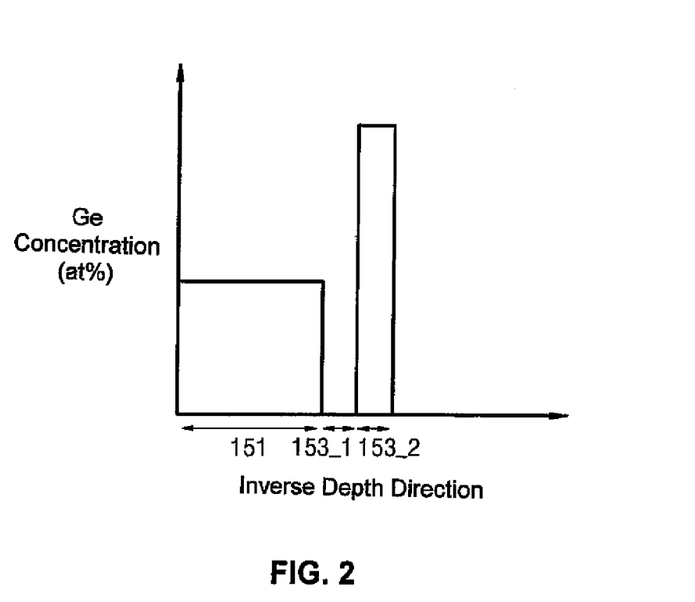
FIGS. 2 and 3 are diagrams illustrating relative Ge concentrations in a depth direction of layers according to an embodiment of the present invention.
Figure 3:
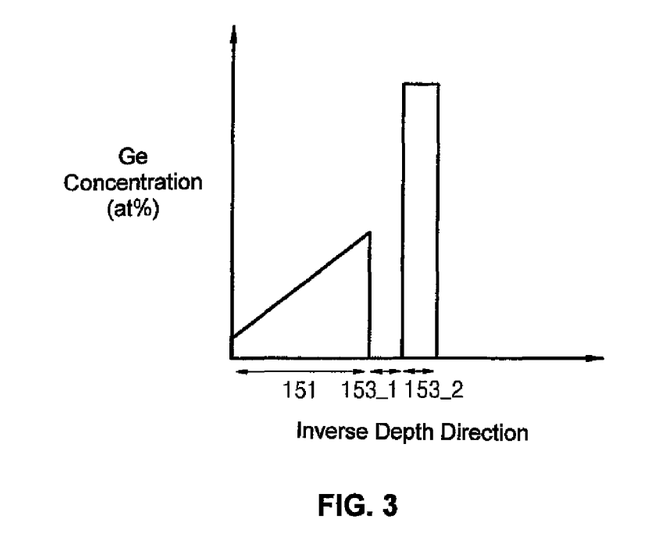

In the case where epitaxial layers 151 and the second capping layer 153_2 are formed of SiGe, a Ge concentration thereof may be characterized by the diagrams shown in FIGS. 2 and 3. For example, as shown in FIG. 2, the Ge concentration of the SiGe epitaxial layers 151 may be substantially constant in the depth direction. Alternately, for example, the Ge concentration may gradually decrease in the depth direction as shown in FIG. 3. In either case, as shown in both diagrams, it is generally preferred that the Ge concentration of the second capping layer exceed that of the SiGe epitaxial layers 151. As examples, the Ge concentration of the SiGe epitaxial layers 151 may be 10 to 30 at %, and the Ge concentration of the SiGe capping layer 153_2 may be 20 to 40 at %.

Figure 1E:
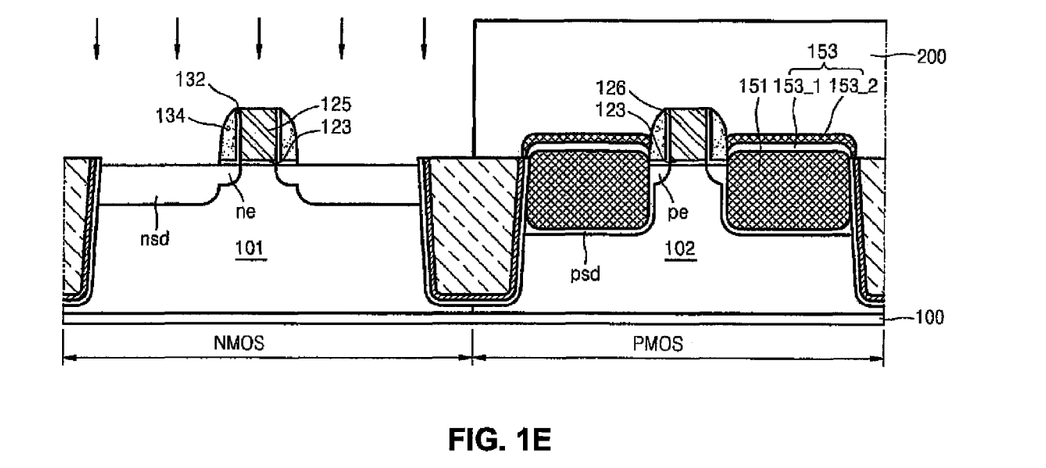

Turning now to FIG. 1E, a mask 200 is formed (e.g., by photolithography) to as to cover the PMOS region and expose the NMOS region of the substrate 100. The mask 200 and the gate structure of the NMOS region are then utilized as masks during ion implantation of n-type dopants to define n-type source/drain regions nsd in the n-well 101.

Figure 1F:
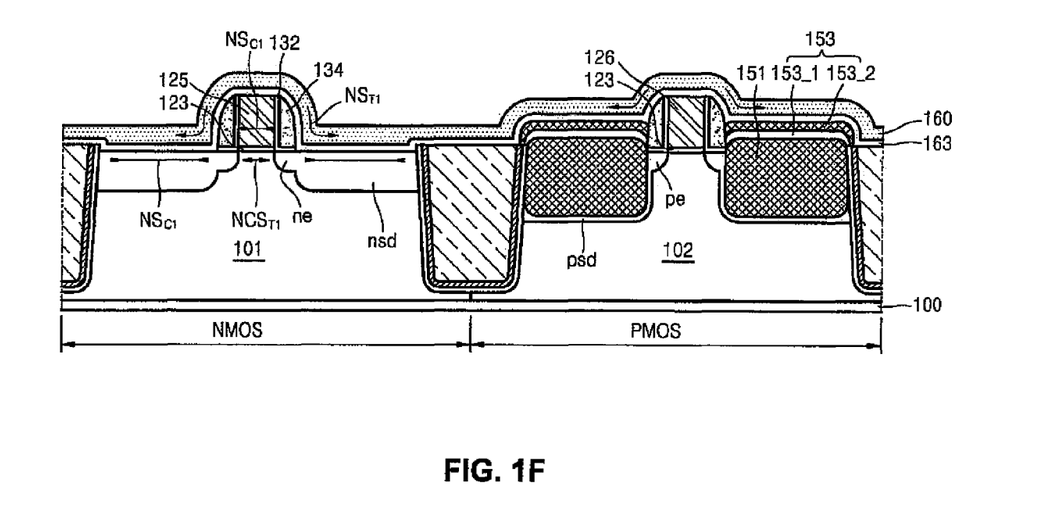

Next, referring to FIG. 1F, a stress memorization (SM) layer 160 is formed over the NMOS and PMOS regions of the substrate 100. Herein, an SM layer is defined as a layer of material which, when subjected to external energy, induces tensile stresses $NS_{T1}$ therein. The SM layer 160 may, for example, be an insulating layer such as SiN. In the present embodiment, the external energy is thermal energy, although the invention is not limited thereto. That is, in the present embodiment, when SM layer 160 is annealed, tensile stresses NSTi are created about the gate structures as shown in FIG. 1F.

The tensile stresses $NS_{T1}$ of the SM layer induces compressive stresses $NS_{C1}$ in the gate electrode 125 and in the source/drain regions nsd. As a result, tensile stress $NCS_T$ is induced in the channel region of the NMOS device.

Also illustrated in FIG. 1F is an etch stop layer 163 which may optionally be interposed between the substrate surface and the SM layer 160. The etch stop layer 163 may, for example, be formed to a thickness of 50 to 100 Å.

It should be noted here that the tensile stresses of the SM layer 160 has relatively little or no adverse impact the adjacent PMOS device underlying a portion of the SM layer. This is due at least in part to the presence of the at least one capping layer 153. That is, the capping layer may reduce the amount of stresses induced in the PMOS device by acting as a physical barrier and/or by reducing the exposed height of the gate electrode 126 over which the SM layer 160 is formed. As such, patterning of the SM layer 160 to remove the same from over the PMOS device is avoided.

Figure 1G:
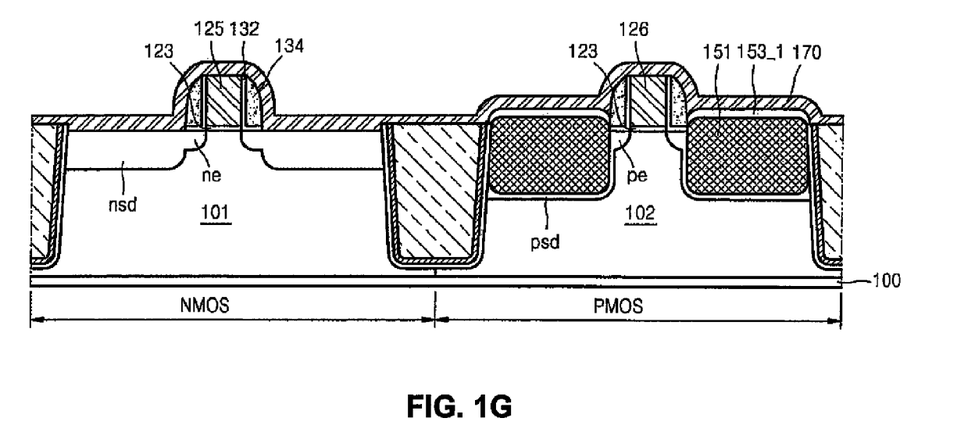

Turning now to FIG. 1G, the SM layer 160, the etch stop layer 163 and the second capping layer 153_2 are removed. For example, the SM layer and the etch stop layer 163 may be removed by an etching process, and the second capping layer may be removed using a cleaning solution (e.g., SC-1 and HF). Then, a metal layer 170 (e.g., Co or Ni) is formed over the surface of the substrate.

Figure 1H:
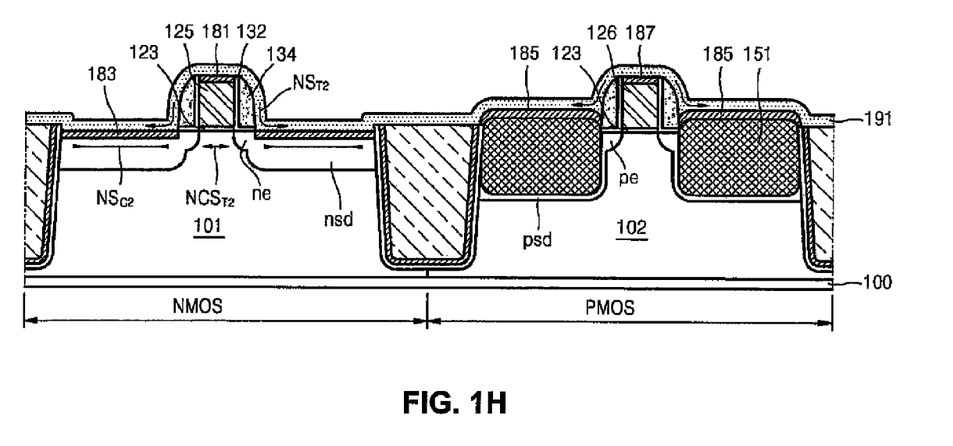

Referring to FIG. 1H, the metal layer 170 (FIG. 1G) is annealed and reacted with the surfaces of the gate electrodes 125 and 126, the source/drain regions nsd, and the source/drain regions psd. As a result, corresponding silicide layers 181, 187, 183 and 185 are formed. Un-reacted metal is then removed, and an insulating layer 191 (e.g., an SiN layer) is deposited over the substrate surface and then annealed. As represented in FIG. 1H, the annealed insulating layer 191 acts as a second SM layer. That is, the annealed insulating layer 191 is under tensile stress $NS_{T2}$ about the gate electrode 125, resulting in compressive stresses $NS_{C2}$ in the source/drain regions nsd, and tensile stress $NCS_{T2}$ in the channel region of the NMOS device.

Figure 1I:
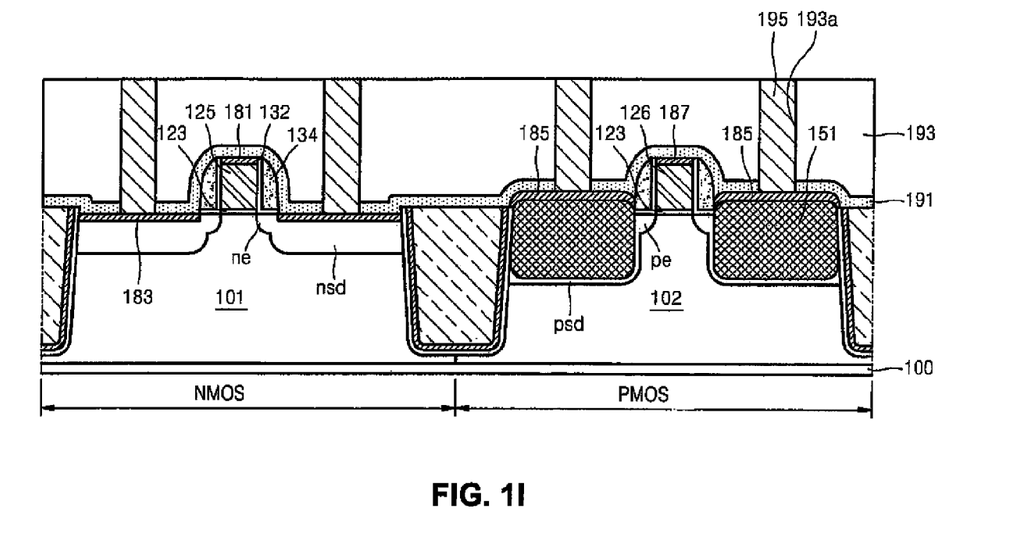

Then, as shown in FIG. 1I, an interlayer dielectric layer (ILD) 193 is deposited over the surface of the substrate, and contact holes 193a are formed in the ILD 193 and insulating layer 191 to expose upper surfaces of the silicide layers 183 and 185 of the source/drain regions nsd and psd. Metal contact plugs 195 are then formed in the contact holes 193a.

Another non-limiting embodiment of the invention will be described next with reference to FIGS. 4A and 4B.

Figure 4A:
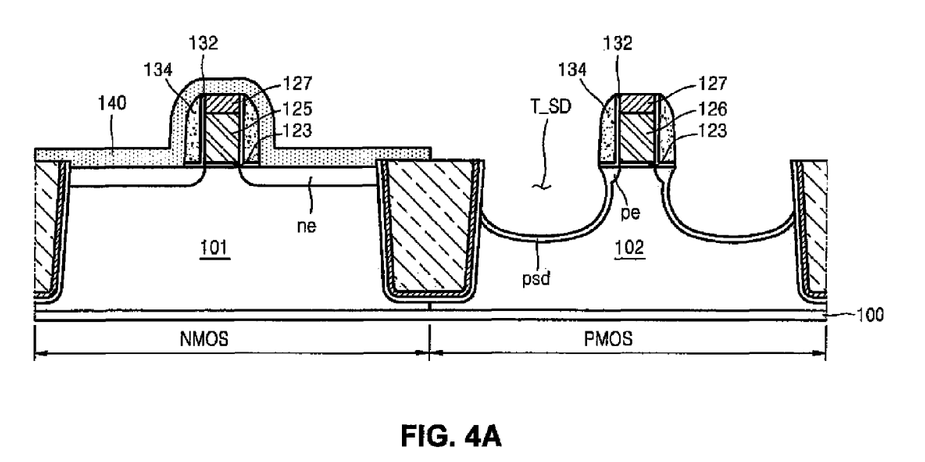
FIGS. 4A and 4B are cross-sectional views for use in explaining a method of manufacturing a semiconductor device according to another embodiment of the present invention.

The processes executed to obtain the structure illustrated by FIG. 4A may be the same as those of previously described FIGS. 1A through 1C, expect that the trenches T_SD are formed by isotropic etching (as opposed to the anisotropic etching of FIG. 1C). As a result, a more rounded trench profile will generally result, and the trenches T_SD will tend to protrude beneath the spacers 132 and 134. The trenches T_SD may, for example, be formed to a depth of 300 to 1200 Å. P-type impurities are then implanted to form p-type source/drain regions psd at bottom and sidewalls of the trenches T_SD.

Figure 4B:
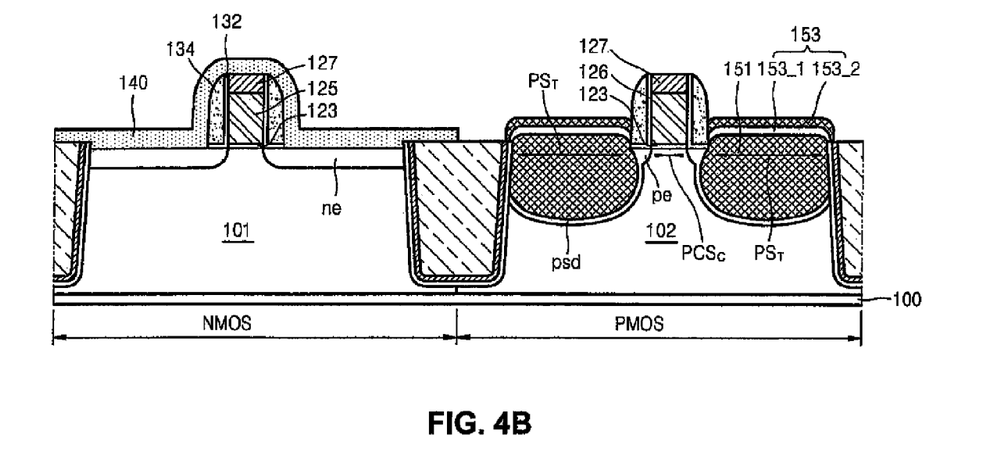

Referring to FIG. 4B, epitaxial layers 151 are grown in the trenches T_SD of the PMOS region. In the example of this embodiment, the epitaxial layers 151 are formed by epitaxial growth of SiGe. Also in the example of this embodiment, the epitaxial layers completely fill the trenches T_SD of the PMOS region, and protrude above a surface of the substrate 100. P-type impurity doping of the epitaxial layers 151 may, for example, be performed in situ during the epitaxial growth process.

As explained previously, the epitaxial layers 151 have a larger lattice constant larger than that of the silicon substrate, and as shown in FIG. 1D, the epitaxial layers 151 are under tensile stress $PS_T$. The resultant deformation in the epitaxial layers 151 induces a compressive stress $PCS_C$ in the channel of the PMOS region. Hole mobility in the channel therefore increases, which in turn enhances the operating speed of the PMOS transistor.

Then, one or more capping layers 153 are formed over the epitaxial layers 151. In particular, in the example of this embodiment, a first capping layer 153_1 and a second capping layer 153_2 are successively formed over the epitaxial layers 151. For example, the first epitaxial layer 153_1 may be formed by epitaxial growth of Si to form a silicon epitaxial capping layer. The second epitaxial layer 153_2 may be formed by epitaxial growth of SiGe to form a SiGe epitaxial capping layer. As examples, the first capping layer 153_1 may be formed to a thickness of 30 to 300 Å, while the second capping layer 153_2 may be formed to a thickness of 100 to 500 Å.

In the case where epitaxial layers 151 and the second capping layer 153_2 are formed of SiGe, a Ge concentration thereof may be characterized by the diagrams shown in FIGS. 2 and 3. For example, as shown in FIG. 2, the Ge concentration of the SiGe epitaxial layers 151 may be substantially constant in the depth direction. Alternately, for example, the Ge concentration may gradually decrease in the depth direction as shown in FIG. 3. In either case, as shown in both diagrams, it is generally preferred that the Ge concentration of the second capping layer exceed that of the SiGe epitaxial layers 151. As examples, the Ge concentration of the SiGe epitaxial layers 151 may be 10 to 30 at %, and the Ge concentration of the SiGe capping layer 153_2 may be 20 to 40 at %.

The remaining processes of this exemplary embodiment may be the same as those described above in connection with FIGS. 1E through 1F, and a detailed description thereof is omitted here to avoid redundancy.

Another non-limiting embodiment of the invention will be described next with reference to FIGS. 5A through 5F.

Figure 6:
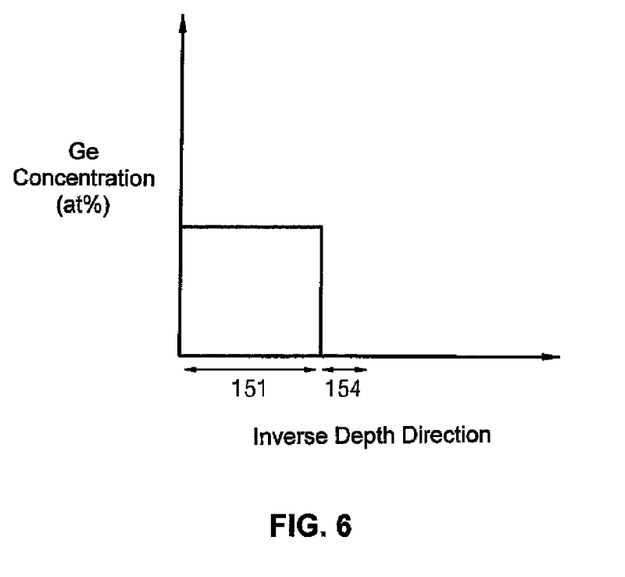
FIG. 6 is a diagram illustrating a relative Ge concentration in a depth direction of layers according to an embodiment of the present invention

The processes executed to obtain the structure illustrated by FIG. 4A may be the same as those of previously described FIGS. 1A through 1D, except that the capping layer is defined by a continuous silicon epitaxial layer 154 grown on the epitaxial layers 151, where the silicon epitaxial layer 154 may, for example, be devoid or substantially devoid of Ge atoms. That is, referring to FIG. 6, in one example the epitaxial layers 151 defining the source/drain regions psd are formed of SiGe, and a Ge concentration is substantially constant in a depth direction, whereas the layer 154 is epitaxial silicon having a Ge concentration of 0 at %.

Figure 5A:
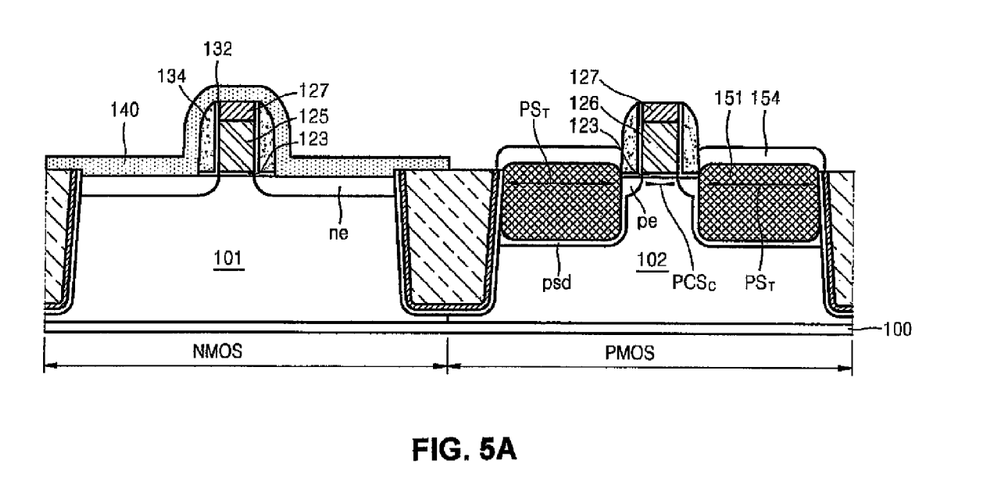
FIGS. 5A through 5F are cross-sectional views for use in explaining a method of manufacturing a semiconductor device according to another embodiment of the present invention.
Figure 5B:
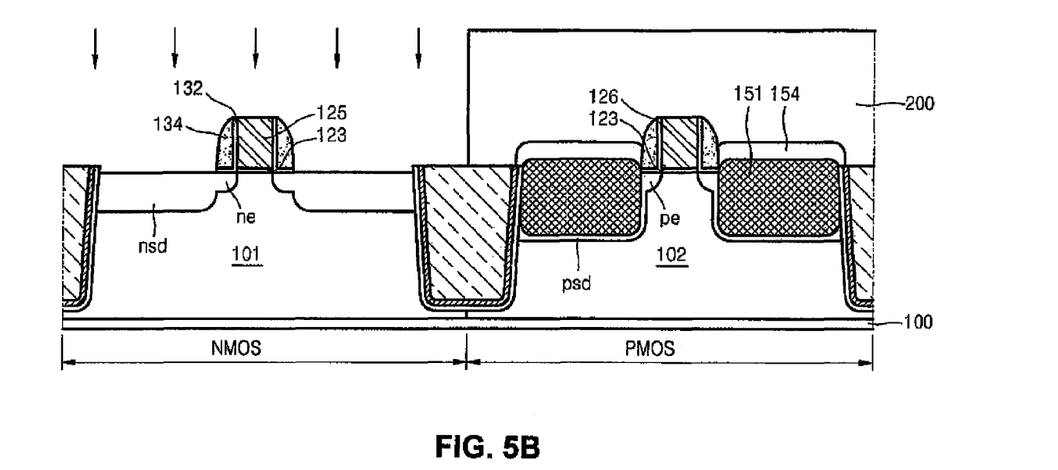

Turning now to FIG. 5B, a mask 200 is formed (e.g., by photolithography) to as to cover the PMOS region and expose the NMOS region of the substrate 100. The mask 200 and the gate structure of the NMOS region are then utilized as masks during ion implantation of n-type dopants to define n-type source/drain regions nsd in the n-well 101.

Figure 5C:
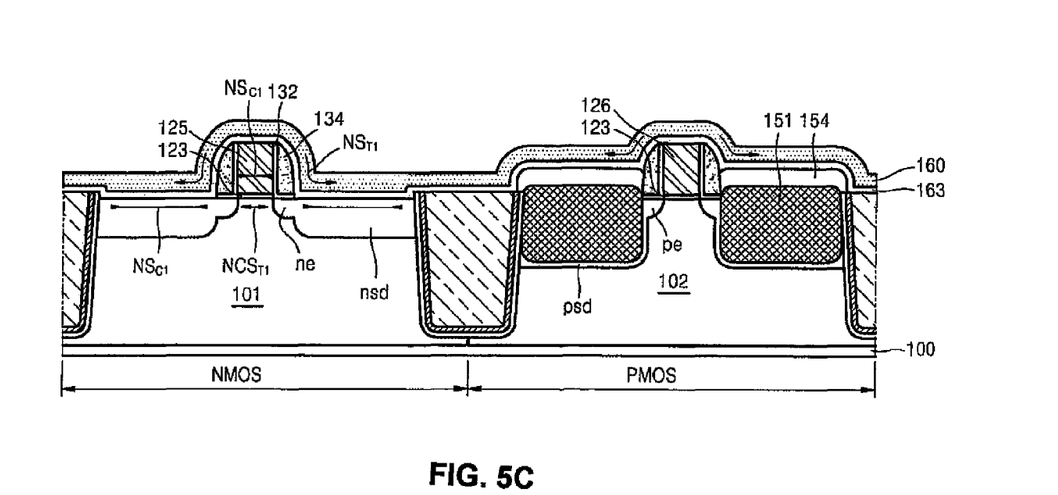

Next, referring to FIG. 5C, a stress memorization (SM) layer 160 is formed over the NMOS and PMOS regions of the substrate 100. Herein, an SM layer is defined as a layer of material which, when subjected to external energy, induces tensile stresses $NS_{T1}$ therein. The SM layer 160 may, for example, be an insulating layer such as SiN. In the present embodiment, the external energy is thermal energy, although the invention is not limited thereto. That is, in the present embodiment, when SM layer 160 is annealed, tensile stresses NSTi are created about the gate structures as shown in FIG. 5C.

The tensile stresses $NS_{T1}$ of the SM layer induces compressive stresses $NS_{C1}$ in the gate electrode 125 and in the source/drain regions nsd. As a result, tensile stress $NCS_{T1}$ is induced in the channel region of the NMOS device.

Also illustrated in FIG. 5C is an etch stop layer 163 which may optionally be interposed between the substrate surface and the SM layer 160. The etch stop layer 163 may, for example, be formed to a thickness of 50 to 100 Å.

It should be noted here that the tensile stresses of the SM layer 160 has relatively little or no adverse impact the adjacent PMOS device underlying a portion of the SM layer. This is due at least in part to the presence of the capping layer 154. That is, the capping layer may reduce the amount of stresses induced in the PMOS device by acting as a physical barrier and/or by reducing the exposed height of the gate electrode 126 over which the SM layer 160 is formed. As such, patterning of the SM layer 160 to remove the same from over the PMOS device is avoided.

Figure 5D:
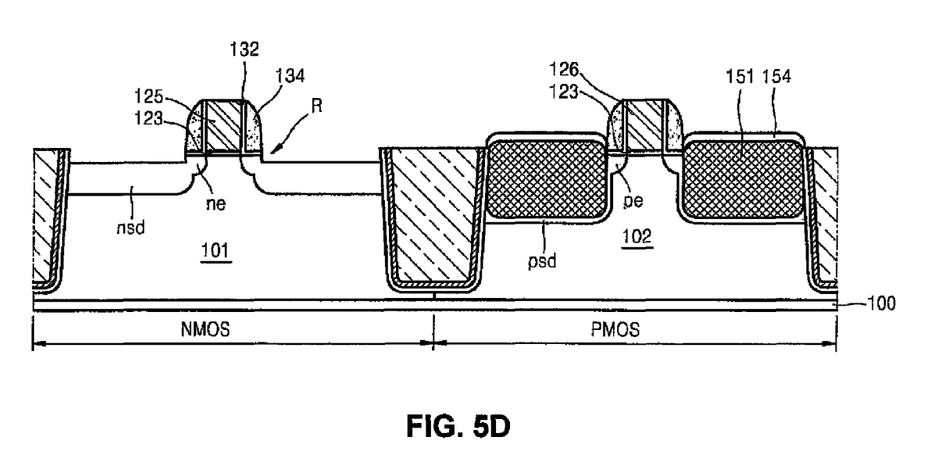

Turning now to FIG. 5D, the SM layer 160, the etch stop layer 163 and a portion of the capping layer 154 are removed. In this case, removal of the portion of the capping layer 154 also results in the formation of a recess R in the substrate surface at the source/drain regions nsd of the NMOS device. The depth of the recess may, for example, be 50 to 150 Å.

Figure 5E:
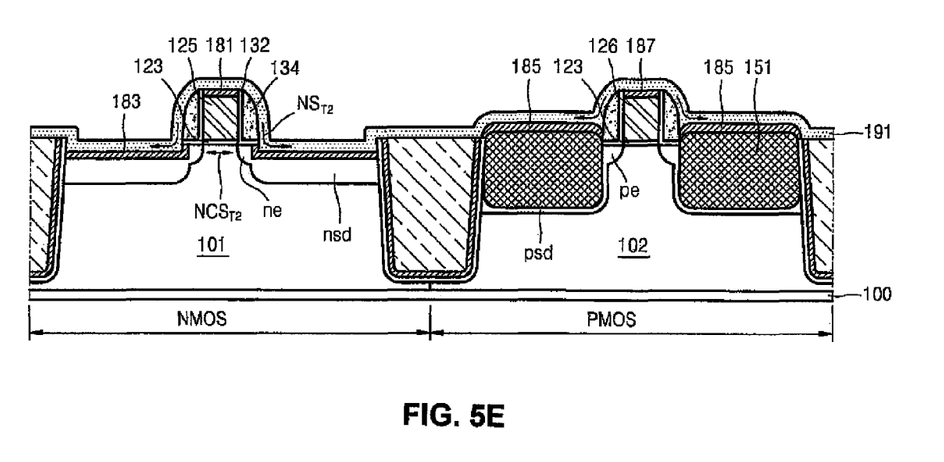

Referring to FIG. 5E, silicide layers 181, 187, 183 and 185 are respectively formed at the surfaces of the gate electrodes 125 and 126, the source/drain regions nsd, and the source/drain regions psd. (See the previous discussion in connection with FIG. 1H in this regard.) Un-reacted metal is then removed, and an insulating layer 191 (e.g., a SiN layer) is deposited over the substrate surface and then annealed. As represented in FIG. 5E, the annealed insulating layer 191 acts as a second SM layer. That is, the annealed insulating layer 191 is under tensile stress $NS_{T2}$ about the gate electrode 125, resulting in compressive stresses $NS_{C2}$ in the source/drain regions nsd, and tensile stress $NCS_{T2}$ in the channel region of the NMOS device.

Further, as a result of the formation of the recess R (FIG. 5D), the channel region of the NMOS device is positioned directly between portions of the insulating layer 191. Thus, the tensile stress of the insulating layer 191 is directly induced in the lateral direction to the channel region of the NMOS device, thus increasing the tensile stress within the channel region. Channel mobility is thereby enhanced.

Figure 5F:
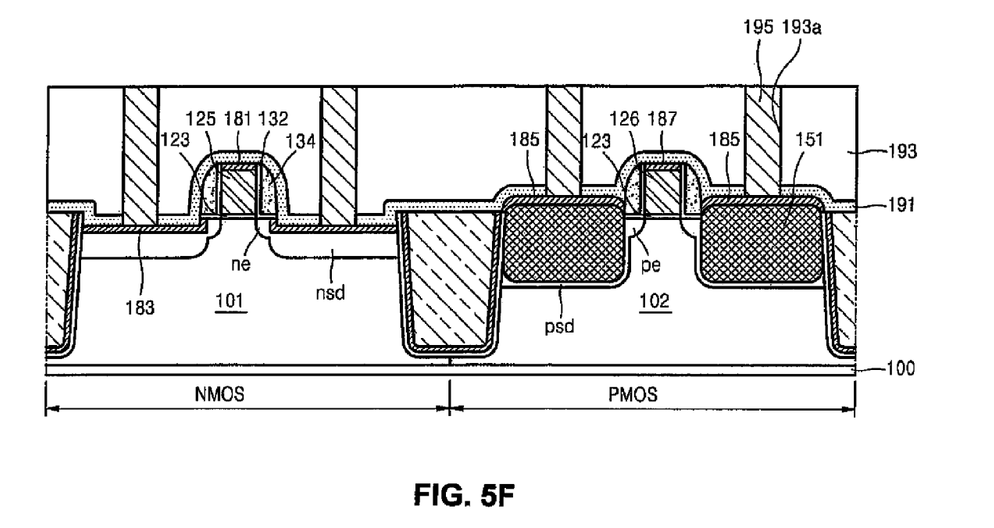

Then, as shown in FIG. 5F, an interlayer dielectric layer (ILD) 193 is deposited over the surface of the substrate, and contact holes 193a are formed in the ILD 193 and insulating layer 191 to expose upper surfaces of the silicide layers 183 and 185 of the source/drain regions nsd and psd. Metal contact plugs 195 are then formed in the contact holes 193a.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A method of fabricating a semiconductor device, comprising:
    forming at least one capping layer over epitaxial source/drain regions of a PMOS device;
    forming a stress memorization (SM) layer over the PMOS device including the at least one capping layer and over an adjacent NMOS device, and treating the SM layer formed over the NMOS and PMOS devices to induce tensile stress in a channel region of the NMOS device, wherein treating the SM layer includes annealing of the SM layer, and
    removing the SM layer after said annealing.

2. The method of claim 1, wherein the epitaxial source/drain regions induce compression strain in a channel region of the PMOS device.

3. The method of claim 1, wherein the at least one capping layer includes a first capping layer formed on the epitaxial source/drain regions, and a second capping layer formed on the first capping layer.

4. The method of claim 3, further comprising removing the second capping layer, and performing a silicide process on the first capping layer.

5. The method of claim 1, wherein the at least one capping layer comprises a single capping layer.

6. The method of claim 5, further comprising partially removing the single capping layer, and subjecting a remaining portion of the single capping layer to a silicide process.

7. The method of claim 6, further comprising forming recesses in the substrate adjacent a gate electrode of the NMOS device simultaneously with said partial removal of the single capping layer.

8. The method of claim 1, wherein the SM layer comprises SiN.

9. A method of fabricating a semiconductor device, comprising:
    forming at least one capping layer over epitaxial source/drain regions of a PMOS device; and
    forming a stress memorization (SM) layer over the PMOS device including the at least one capping layer and over an adjacent NMOS device, and treating the SM layer formed over the NMOS and PMOS devices to induce tensile stress in a channel region of the NMOS device,
    wherein the epitaxial source/drain regions are formed by forming trenches adjacent a gate electrode of the PMOS device, and epitaxially growing the source/drain regions within the trenches to induce compression strain within a channel of the PMOS device, wherein the epitaxial source/drain regions comprise SiGe, and
    wherein the at least one capping layer includes a first capping layer formed on the epitaxial source/drain regions, and a second capping layer of SiGe on the first capping layer, wherein a Ge concentration of the second capping layer is greater than a Ge concentration of the SiGe source/drain regions.

10. The method of claim 9, further comprising in situ doping of the SiGe source/drain regions with a p-type impurity.

11. The method of claim 9, wherein the trenches are formed by anisotropic etching.

12. A method of fabricating a semiconductor device, comprising:
    forming at least one capping layer over epitaxial source/drain regions of a PMOS device; and
    forming a stress memorization (SM) layer over the PMOS device including the at least one capping layer and over an adjacent NMOS device, and treating the SM layer formed over the NMOS and PMOS devices to induce tensile stress in a channel region of the NMOS device,
    wherein the epitaxial source/drain regions are formed by forming trenches adjacent a gate electrode of the PMOS device, and epitaxially growing the source/drain regions within the trenches to induce compression strain within a channel of the PMOS device, and
    wherein the trenches are formed by isotropic etching.

13. A method of manufacturing a semiconductor device, comprising:
    providing a substrate including an NMOS region and a PMOS region, and gate structures respectively located over the NMOS region and PMOS region;

forming first and second trenches in the substrate adjacent the gate structure of the PMOS region;

forming epitaxial source and drain regions within the first and second trenches, respectively;

forming at least one capping layer over the epitaxial source and drain regions;

forming a stress memorization (SM) layer over the NMOS and PMOS regions, including the at least one capping layer;

annealing the SM layer formed over the NMOS and PMOS regions; and removing the annealed SM layer from over the NMOS and PMOS regions.

14. The method of claim 13, wherein the at least one capping layer comprises first and second capping layer, the first capping layer located between the second capping layer and the epitaxial source and drain regions.

15. The method of claim 14, wherein said method further comprises removing the second capping layer and subjecting the first capping layer to a silicide process.

16. The method of claim 14, wherein the epitaxial source and drain regions and the second capping layer comprise SiGe, and the first capping layer comprises Si.

17. The method of claim 16, wherein a Ge concentration of the second capping layer is greater than a Ge concentration of the epitaxial source and drain regions.

18. The method of claim 13, further comprising in situ doping of the epitaxial source and drain regions with a p-type impurity.

19. The method of claim 13, wherein the at least one capping layer includes a single capping layer comprising epitaxial Si.

20. The method of claim 19, further comprising partially removing the single capping layer, and subjecting a remaining portion of the single capping layer to a silicide process.

21. The method of claim 20, further comprising forming recesses in the substrate adjacent the gate structure of the NMOS device simultaneously with said partial removal of the single capping layer.

22. The method of claim 13, wherein the SM layer comprises SiN.

23. A method of manufacturing a semiconductor device comprising interposing at least one capping layer between a PMOS device and a stress memorization (SM) layer, and treating the SM layer to induce tensile stress in an NMOS device located adjacent the PMOS device, and removing the SM layer and a portion of the at least one capping layer, subjecting a remaining portion of the at least one capping layer to a silicide process, forming a second SM layer over a resultant structure, and annealing the second SM layer to further induce tensile stress in the NMOS device.

* * * * *